(12) United States Patent
Khlat et al.

(10) Patent No.: US 11,876,488 B2
(45) Date of Patent: Jan. 16, 2024

(54) DC-DC BOOST CONVERTER

(71) Applicant: Qorvo US, Inc., Greensboro, NC (US)

(72) Inventors: Nadim Khlat, Cugnaux (FR); Michael R. Kay, Summerfield, NC (US); Jeffrey D. Potts, Mocksville, NC (US); Michael J. Murphy, Statesville, NC (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 17/841,723

(22) Filed: Jun. 16, 2022

(65) Prior Publication Data

US 2022/0407420 A1 Dec. 22, 2022

Related U.S. Application Data

(60) Provisional application No. 63/211,898, filed on Jun. 17, 2021.

(51) Int. Cl.
*H02M 3/07* (2006.01)
*H03F 1/02* (2006.01)
*H02J 7/02* (2016.01)
*H03F 3/24* (2006.01)

(52) U.S. Cl.
CPC ............. *H03F 1/0227* (2013.01); *H02J 7/02* (2013.01); *H02M 3/07* (2013.01); *H03F 3/245* (2013.01); *H02J 2207/20* (2020.01); *H03F 2200/451* (2013.01)

(58) Field of Classification Search
CPC ........................................................ H02M 3/07
See application file for complete search history.

(56) References Cited

U.S. PATENT DOCUMENTS

| | | | | |
|---|---|---|---|---|
| 10,615,687 B1* | 4/2020 | Khlat | ...................... | H02M 3/07 |
| 2011/0241766 A1* | 10/2011 | Zhang | ...................... | H02M 3/07 |
| | | | | 327/536 |
| 2014/0070787 A1* | 3/2014 | Arno | ...................... | H02M 3/02 |
| | | | | 323/304 |
| 2020/0136561 A1* | 4/2020 | Khlat | ...................... | H03F 3/195 |
| 2022/0302826 A1* | 9/2022 | Matei | ...................... | H02M 3/158 |

* cited by examiner

*Primary Examiner* — Sibin Chen
(74) *Attorney, Agent, or Firm* — Withrow & Terranova, P.L.L.C.

(57) ABSTRACT

The present disclosure discloses a direct current (DC)-DC boost converter, which includes a battery terminal providing a battery voltage, a charge pump coupled between the battery terminal and an interior node, and a power inductor coupled between the interior node and a power supply terminal that provides a power voltage to a radio frequency transceiver. The charge pump is configured to provide an interior voltage at the interior node based on the battery voltage. Herein, the interior voltage toggles between the battery voltage and two times the battery voltage. The charge pump includes a first switch coupled between the battery terminal and the interior node, a second switch coupled between the battery terminal and a connecting node, a third switch coupled between the connecting node and ground, and a flying capacitor coupled between the interior node and the connecting node of the second switch and the third switch.

18 Claims, 3 Drawing Sheets

DC-DC BOOST CONVERTER

RELATED APPLICATIONS

This application claims the benefit of provisional patent application Ser. No. 63/211,898, filed Jun. 17, 2021, the disclosure of which is hereby incorporated herein by reference in its entirety.

FIELD OF THE DISCLOSURE

The present disclosure relates to a direct current (DC)-DC boost converter that provides power to a radio frequency (RF) amplifier in a RF transceiver.

BACKGROUND

A direct current (DC)-DC converter is a power converter that converts a source of DC from one voltage level to another. There are various types of DC-DC converters including buck, boost, or buck/boost converters. The buck and boost converters develop decreased and increased output voltages relative to an input voltage, respectively. The buck/boost converter may function as either a buck or a boost converter.

Electronic devices and systems often request conversion of an input voltage to an output voltage, which may be higher or lower than or approximately the same as the input voltage. For Wi-Fi cellular applications, a power source voltage, such as a battery voltage, is normally required to convert to a higher supply voltage, which is optimized to a power amplifier (PA) of a transmitter for higher data rates. For instance, Wi-Fi transmission operates at a high frequency (like 5 GHz) and requires high efficiency, and the PA typically needs a relatively high supply voltage. As such, one DC-DC converter may only need to be used to boost a relatively low battery voltage (like 3.2V) to a relatively high supply voltage (like 5.5V) for the PA without dropping the battery voltage to a lower voltage level.

Compared to the buck/boost converter, the boost converter, which may have a smaller die solution and simpler circuit structures, may be sufficient for Wi-Fi cellular applications. However, traditional boost converters have relatively high noise and high ripple, and may have a relatively slow response time. Accordingly, it is an object of the present disclosure to design an improved DC-DC boost converter to reduce the noise/ripple and enhance conversion efficiency without significantly increasing the die size or circuit complexity.

SUMMARY

The present disclosure relates to a direct current (DC)-DC boost converter that provides power to a radio frequency (RF) amplifier in a RF transceiver. The disclosed DC-DC boost converter includes a battery terminal providing a battery voltage, a charge pump coupled between the battery terminal and an interior node, and a power inductor coupled between the interior node and a power supply terminal that provides a power voltage to the RF transceiver. Herein, the charge pump includes a flying capacitor, a first switch, a second switch, and a third switch, and is configured to provide an interior voltage at the interior node based on the battery voltage. The interior voltage toggles between the battery voltage and two times the battery voltage. The first switch is coupled between the battery terminal and the interior node, such that the interior node is connected to the battery terminal when the first switch is closed. The second switch is coupled between the battery terminal and a connecting node, such that the connecting node is connected to the battery terminal when the second switch is closed. The third switch is coupled between the connecting node and ground, such that the connecting node is connected to ground when the third switch is closed. The flying capacitor is coupled between the interior node and the connecting node of the second switch and the third switch.

In one embodiment of the DC-DC boost converter, each of the first switch, the second switch, and the third switch is implemented by a field-effect transistor (FET).

In one embodiment of the DC-DC boost converter, each of the first switch and the second switch is implemented by a P-type FET (PFET), and the third switch is implemented by a N-type FET (NFET).

In one embodiment of the DC-DC boost converter, each of the first switch, the second switch, and the third switch is a microelectromechanical system (MEMS) switch.

In one embodiment of the DC-DC boost converter, the charge pump operates in a charging phase and then in a discharge phase to boost the interior voltage to about two times the battery voltage. Herein, during the charging phase, the first switch and the third switch are closed, while the second switch is open. After the flying capacitor is charged to a same voltage as the battery voltage, the first switch and the third switch are open, while the second switch is closed during the discharge phase.

According to one embodiment, the DC-DC boost converter further includes a pulse-width modulation (PWM) controller. The PWM controller is configured to receive a target power voltage, which is a target power level requested for the RF transceiver, and the power voltage at the power supply terminal as feedback.

According to one embodiment, the DC-DC boost converter further includes a digital-to-analog converter (DAC), which provides the target power voltage.

According to one embodiment, the DC-DC boost converter further includes a tracking amplifier with a first input port, a second input port, and an output port. Herein, the tracking amplifier receives a power voltage from a power terminal for operation. In addition, the first input port of the tracking amplifier receives the target power voltage from the DAC, the second input port of the tracking amplifier is coupled to the power supply terminal to receive the power voltage as feedback, and the output port of the tracking amplifier is coupled to the power supply terminal. The tracking amplifier is configured to provide a tracked voltage in response to a difference between the target power voltage and the power voltage.

According to one embodiment, the DC-DC boost converter further includes an offset capacitor coupled between the output port of the tracking amplifier and the power supply terminal. The offset capacitor is configured to provide an offset voltage to raise the tracked voltage to the power voltage so as to lower a minimum requirement of the power voltage for the tracking amplifier.

According to one embodiment, the DC-DC boost converter further includes a mode switch coupled between the output port of the tracking amplifier and ground. The mode switch is configured to enable or disable the tracking amplifier.

According to one embodiment, the DC-DC boost converter further includes a bypass capacitor coupled between the power supply terminal and ground.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

Figure 1:
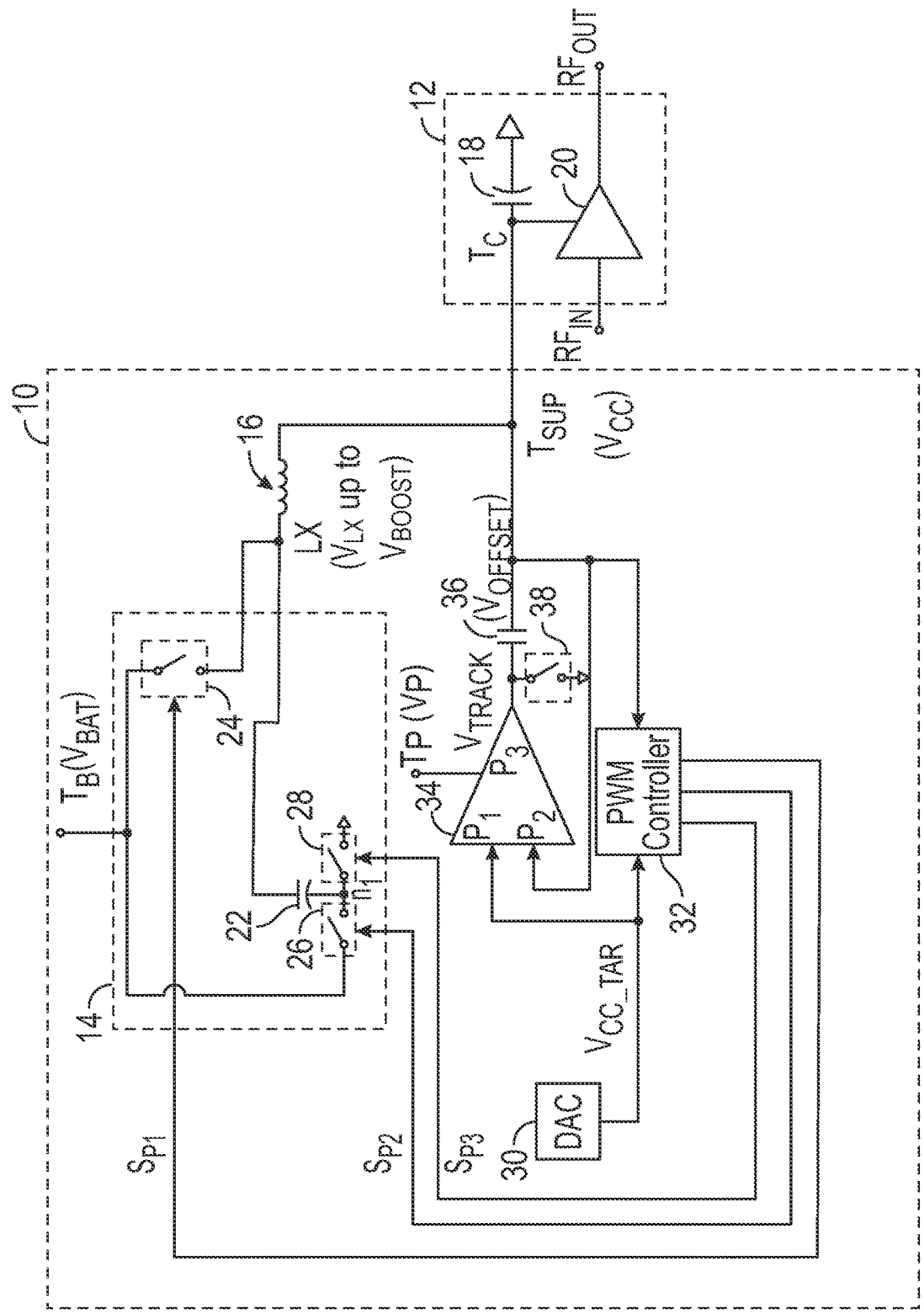
FIG. 1 shows a direct current (DC)-DC boost converter according to one embodiment of the present disclosure.
Figure 2A:
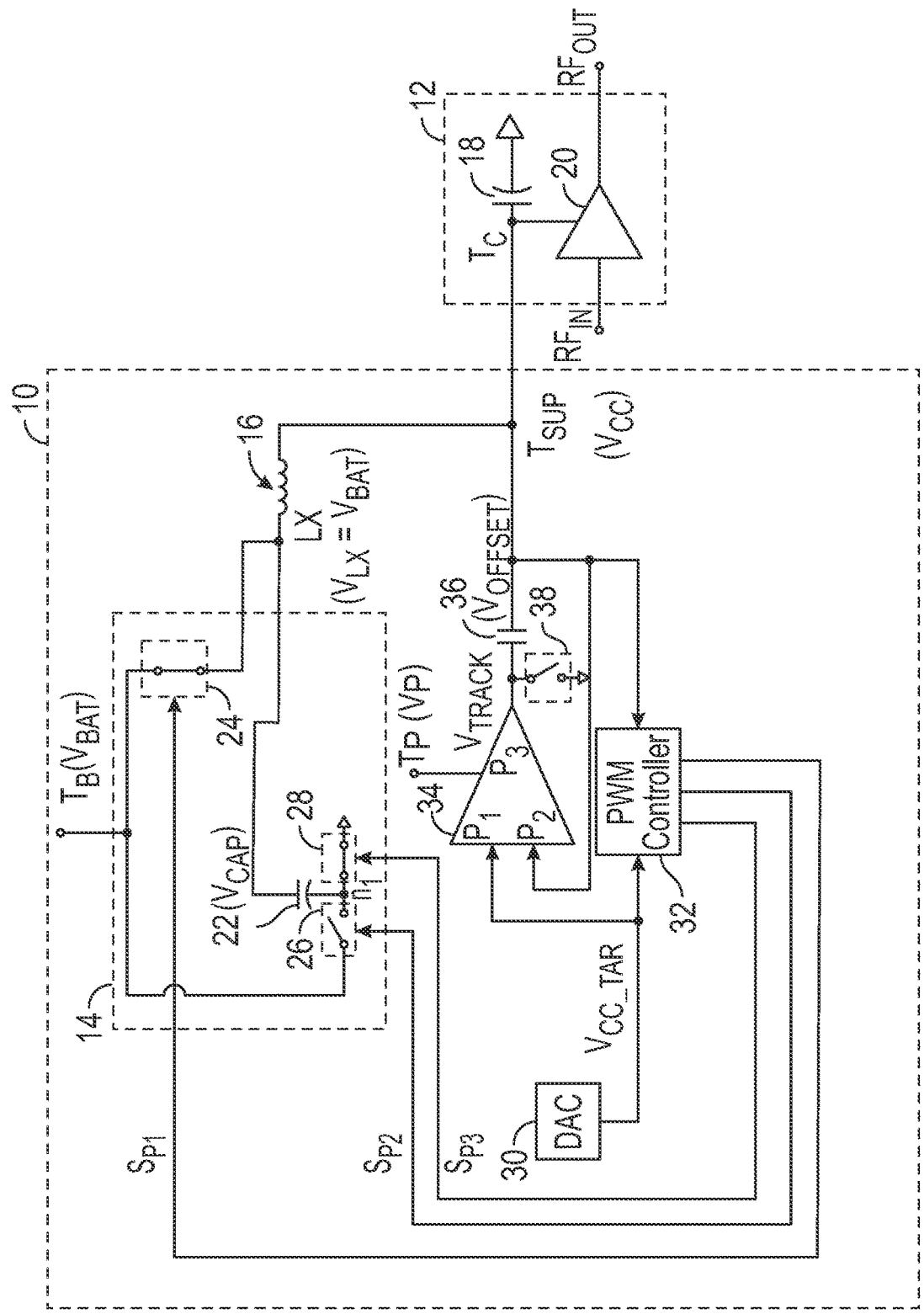
FIGS. 2A-2B show operation phases of the DC-DC boost converter illustrated in FIG. 1.
Figure 2B:
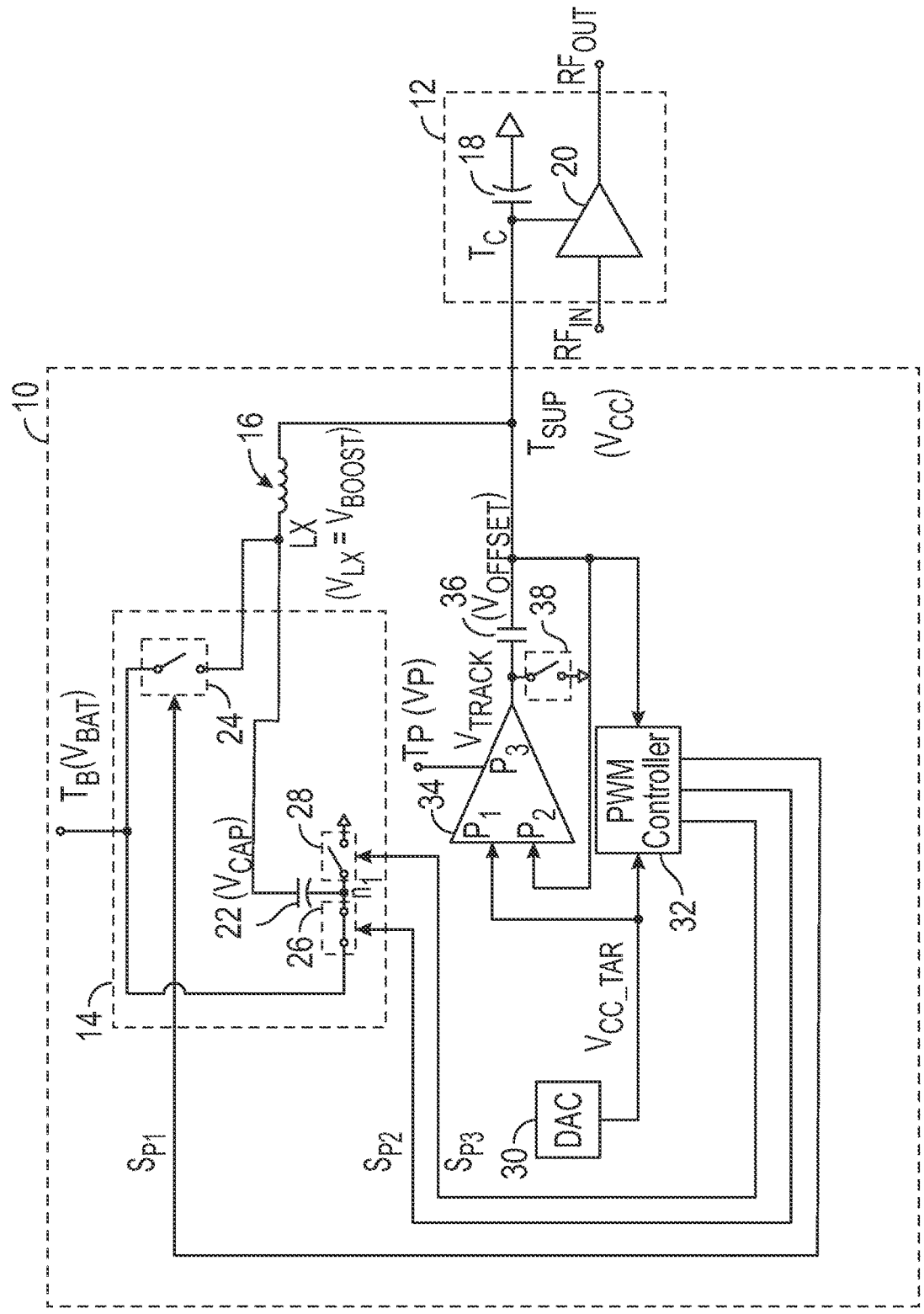

It will be understood that for clear illustrations, FIGS. 1-2B may not be drawn to scale.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

The present disclosure relates to a direct current (DC)-DC boost converter that is capable of boosting a relatively low input voltage (e.g., a battery voltage, ~3.2V) to a relatively high supply voltage (e.g., a supply voltage to a power amplifier, ~5.5V) for Wi-Fi cellular applications. FIG. 1 shows an exemplary DC-DC boost converter 10, which is configured to provide a power voltage $V_{CC}$ to a radio frequency (RF) transceiver 12 based on a received battery voltage $V_{BAT}$. Herein, the battery voltage $V_{BAT}$ has a lower voltage level than the power voltage $V_{CC}$.

The DC-DC boost converter 10 at least includes a charge pump 14 and a power inductor 16, while the RF transceiver 12 at least includes a bypass capacitor 18 and a power amplifier 20. Herein, the charge pump 14 is coupled between the battery terminal $T_B$ and an interior node LX, and configured to provide an interior voltage $V_{LX}$ at the interior node LX based on the battery voltage $V_{BAT}$ at the battery terminal $T_B$. The interior voltage $V_{LX}$ provided by the charge pump 14 at the interior node LX is capable of reaching a boosted voltage level $V_{BOOST}$ (e.g., $2*V_{BAT}$). With a different structure/configuration, the boosted voltage level $V_{BOOST}$ that can be achieved by the charge pump 14 may have a different scale of the battery voltage $V_{BAT}$. The power inductor 16 is coupled between the interior node LX and a power supply terminal $T_{SUP}$, which provides the power voltage $V_{CC}$ to the power amplifier 20 in the RF transceiver 12. The power inductor 16 filters power generated by the charge pump 14. In particular, the power inductor 16 is configured to filter power flowing from the interior node LX to the power supply terminal $T_{SUP}$ (i.e., filtering out an undesired alternative current (AC) noise portion of a current signal transferring from the interior node LX toward the power supply terminal $T_{SUP}$). Therefore, the power voltage $V_{CC}$ at the power supply terminal $T_{SUP}$ has a same DC portion of the interior voltage $V_{LX}$, which can achieve the boosted voltage level $V_{BOOST}$ (e.g., $2*V_{BAT}$).

In the RF transceiver 12, the bypass capacitor 18 is coupled between the power supply terminal $T_{SUP}$ and ground, and may be charged up to the boosted voltage level $V_{BOOST}$ ($2*V_{BAT}$). A combination of the bypass capacitor 18 and the power inductor 16 forms a LC filter to prevent ripples in the power voltage $V_{CC}$. In some applications, the bypass capacitor 18 may be included in the DC-DC boost converter 10 instead of in the RF transceiver 12. However, the bypass capacitor 18 is always coupled between the power supply terminal $T_{SUP}$ and ground. In addition, the power amplifier 20 is coupled to the power supply terminal $T_{SUP}$, utilizes the power voltage $V_{CC}$ as a power supply, and is configured to amplify an RF input signal $RF_{IN}$ to an RF output signal $RF_{OUT}$. Other electronic components within the RF transceiver 12 are not shown for simplicity.

For the purpose of this illustration, the charge pump 14 includes a flying capacitor 22 and three switches, a first switch 24, a second switch 26, and a third switch 28. The first switch 24 is coupled between the battery terminal $T_B$ and the interior node LX, the second switch 26 is coupled between the battery terminal $T_B$ and the third switch 28, and the third switch 28 is coupled between the second switch 26 and ground. The flying capacitor 22 is coupled between the interior node LX and a connecting node $n_1$, which is a connecting joint of the second switch 26 and the third switch 28. As such, when the first switch 24 is closed, the interior node LX is connected to the battery terminal $T_B$ (with the battery voltage $V_{bat}$). When the second switch 26 is closed, the connecting node $n_1$ is connected to the battery terminal $T_B$ (with the battery voltage $V_{bat}$). When the third switch is closed, the connecting node $n_1$ is connected to ground (with a zero voltage). In one embodiment, each switch 24/26/28 within the charge pump 14 may be implemented by a field-effect transistor (FET). The first and second switches 24 and 26 may be p-type FETs (PFET), while the third switch 28 may be a n-type FET (NFET). In one embodiment, each switch 24/26/28 within the charge pump 14 may be a microelectromechanical system (MEMS) switch.

In order to selectively open or close the switches 24, 26, and 28 in the charge pump 14, the DC-DC boost converter 10 also includes a digital-to-analog converter (DAC) 30 and a pulse-width modulation (PWM) controller 32. The PWM controller 32 is configured to receive a target power voltage $V_{CC\_TAR}$ from the DAC 30 and the power voltage $V_{CC}$ at the power supply terminal $T_{SUP}$ as feedback and is configured to control the opening and closing of the first switch 24, the second switch 26, and the third switch 28 in the charge pump 14. The target power voltage $V_{CC\_TAR}$ is a target power level requested for the power amplifier 20 of the RF transceiver 12.

Herein, the first switch 24, the second switch 26, and the third switch 28 in the charge pump 14 are controlled by the PWM controller 32 via a first PWM signal $S_{p1}$, a second PWM signal $S_{p2}$, and a third PWM signal $S_{p3}$, respectively. For instance, when each of the first switch 24 and the second switch 26 is implemented by a PFET and the first and second PWM signals $S_{p1}$ and $S_{p2}$ are low, the first and second switches 24 and 26 are conducted (i.e., closed), while when the first and second PWM signals $S_{p1}$ and $S_{p2}$ are high, the first and second switches 24 and 26 are not conducted (i.e., open). When the third switch 28 is implemented by a NFET and the third PWM signal $S_{p3}$ is high, the third switch 28 is conducted (i.e., closed), while when the third PWM signal $S_{p3}$ is low, the third switch 28 is not conducted (i.e., open). The first, second, or third PWM signals $S_{p1}$, $S_{p2}$, or $S_{p3}$ is provided to a corresponding FET gate of the first, second, or third switches 24, 26, or 28, respectively. The PWM controller 32 controls a duty cycle of each of the PWM signals $S_{p1}$, $S_{p2}$, and $S_{p3}$, so as to determine how long each of the first switch 24, the second switch 26, and the third switch 28 should open/close.

In some applications, the DC-DC boost converter 10 may further include a tracking amplifier 34 to ensure that the power voltage $V_{CC}$ tracks the target power voltage $V_{CC\_TAR}$ provided by the DAC 30. The tracking amplifier 34 receives a power voltage $V_P$ from a power terminal $T_P$ for operation. The tracking amplifier 34 has a first input port $P_1$ coupled to the DAC 30 to receive the target power voltage $V_{CC\_TAR}$, a second input port $P_2$ coupled to the power supply terminal $T_{SUP}$ to receive the power supply $V_{CC}$ as feedback, and an output port $P_3$ to provide a tracked voltage $V_{TRACK}$. The tracked voltage $V_{TRACK}$ may be varied with time and is a scaled difference between the feedback power supply $V_{CC}$ and the target power voltage $V_{CC\_TAR}$. In a non-limiting example, the output port $P_3$ of the tracking amplifier 34 is coupled to the power supply terminal $T_{SUP}$ via an offset capacitor 36, which is configured to provide an offset voltage $V_{OFFSET}$. The offset voltage $V_{OFFSET}$, which may be 1 V for example, may help raise the tracked voltage $V_{TRACK}$ to the power supply $V_{CC}$ ($V_{CC}=V_{TRACK}+V_{OFFSET}$) at the power supply terminal $T_{SUP}$, thus helping to lower a minimum requirement of the power voltage $V_P$ for the tracking amplifier 34, and thereby improve power efficiency in the DC-DC boost converter 10.

In one embodiment, a mode switch 38 may be coupled between the output port $P_3$ of the tracking amplifier 34 and the ground. The mode switch 38 is configured to disable the tracking amplifier 34 when the mode switch 38 is closed and is configured to enable the tracking amplifier 34 when the mode switch 38 is open. The tracking amplifier 34 may be disabled (i.e., when the mode switch 38 is closed) during a higher power demand operation such as an average power tracking (APT) operation and enabled (i.e., when the mode switch 38 is open) during a lower power demand operation such as an envelope tracking (ET) operation.

FIGS. 2A-2B show operation phases of the DC-DC boost converter 10 based on the battery voltage $V_{BAT}$. FIG. 2A shows a charging phase of the DC-DC boost converter 10. During the charging phase, the PWM controller 32 commands the first switch 24 and the third switch 28 to close, and the second switch 26 to open. As such, the flying capacitor 22 is electrically coupled between the battery terminal $T_B$ and ground, the interior node LX is connected to the battery terminal $T_B$, and the connecting node $n_1$ is connected to ground. In this phase, the interior voltage $V_{LX}$ at the interior node LX is equal to the battery voltage $V_{BAT}$. Since the interior node LX is connected to the power supply terminal $T_{SUP}$ via the power inductor 16 (the power inductor 16 filters out the AC noise portion in the power flow from the interior node LX to the power supply terminal $T_{SUP}$), the power voltage $V_{CC}$ at the power supply terminal $T_{SUP}$ has a same DC portion of the interior voltage $V_{LX}$. In the charging phase, the power voltage $V_{CC}$ is about the same as the battery voltage $V_{BAT}$. In addition, a voltage level at the connecting node $n_1$ is equal to zero voltage, and a capacitor voltage $V_{CAP}$ across the flying capacitor 22 can achieve about the same voltage as the battery voltage $V_{BAT}$. Notice that if a voltage endurance of the first switch 24 is smaller than the battery voltage $V_{BAT}$, the first switch 24 may need to be replaced by two or more first switches stacked in series between the battery terminal $T_B$ and the interior node LX.

FIG. 2B shows a discharging phase of the DC-DC boost converter 10, after the flying capacitor 22 is charged about the same as the battery voltage $V_{BAT}$ (i.e., $V_{CAP}=V_{BAT}$). During the discharging phase, the PWM controller 32 commands the second switch 26 to close, and the first switch 24 and the third switch 28 to open. As such, the flying capacitor 22 is coupled between the battery terminal $T_B$ and the interior node LX, and the connecting node $n_1$ is connected to the battery terminal $T_B$ with the battery voltage $V_{BAT}$. The voltage level at the connecting node $n_1$ changes from zero to the battery voltage $V_{BAT}$, and the interior voltage $V_{LX}$ at the interior node LX will be boosted to $V_{BOOST}=2*V_{BAT}$. It is because the capacitor voltage $V_{CAP}$ across the flying capacitor 22 is about the same as the battery voltage $V_{BAT}$ and cannot change instantly. Once the voltage level at the connecting node $n_1$ changes to the battery voltage $V_{BAT}$, the interior voltage $V_{LX}$ at the interior node LX needs to be boosted to $2*V_{BAT}$ to keep the voltage difference $V_{CAP}$ across the flying capacitor 22 as $V_{BAT}$. Herein, if a voltage endurance of the second switch 26 is smaller than the battery voltage $V_{BAT}$, the second switch 26 may need to be replaced by two or more second switches stacked in series between the battery terminal $T_B$ and the connecting node $n_1$. As described above, the interior node LX is connected to the power supply terminal $T_{SUP}$ through the power inductor 16 (the power inductor 16 filters out the AC noise portion in the power flow from the interior node LX to the power supply terminal $T_{SUP}$). Therefore, the power voltage $V_{CC}$ at the power supply terminal $T_{SUP}$ also maintains a same DC portion of the interior voltage $V_{LX}$ during the discharging phase, and can achieve the boosted voltage level $V_{BOOST}=2*V_{BAT}$.

It is clear that the interior voltage $V_{LX}$ provided by the charge pump 14 at the interior node LX toggles between the battery voltage level $V_{BAT}$ and the boosted voltage level $V_{BOOST}=2*V_{BAT}$ during the charging phase and the discharging phase. In other words, the interior voltage $V_{LX}$ provided by the charge pump 14 at the interior node LX is no smaller than the battery voltage $V_{BAT}$. By controlling the duty cycle of each of the PWM signals $S_{p1}$, $S_{p2}$, and $S_{p3}$, the lengths of the charging phase and the discharging phase are determined (how long each of the first switch 24, the second switch 26, and the third switch 28 should open/close is determined). Therefore, an average value of the interior voltage $V_{LX}$ provided by the charge pump 14 can be tuned.

In addition, since the interior node LX is connected to the power supply terminal $T_{SUP}$ through the power inductor 16 (the power inductor 16 filters out the AC noise portion in the power flow from the interior node LX to the power supply terminal $T_{SUP}$), the power voltage $V_{CC}$ at the power supply terminal $T_{SUP}$ always maintains the same DC portion of the interior voltage $V_{LX}$. As such, the power voltage $V_{CC}$ provided at the power supply terminal $T_{SUP}$ is no smaller than the battery voltage $V_{BAT}$, and an average value of the power voltage $V_{CC}$ can be tuned to achieve a relatively high efficiency of the DC-DC boost converter 10 for the RF transceiver 12. The DC-DC boost converter 10 provides a boosting mode (i.e., providing an output no smaller than an input) by utilizing the charging and discharging phases, in which a current flow is always maintained through the power inductor 16.

The power voltage $V_{CC}$ provided at the power supply terminal $T_{SUP}$ may not be below the battery voltage $V_{BAT}$, and the DC-DC boost converter 10 may not achieve a buck mode. However, since the power amplifier 20 in the RF transceiver 12 requires a relatively high-power supply, which is typically larger than the battery voltage $V_{BAT}$, the boosting functionality provided by the DC-DC boost converter 10 is sufficient for the RF transceiver 12 or other Wi-Fi cellular applications. Compared to a DC-DC converter providing both bucking and boosting functionalities, the DC-DC boost converter 10 utilizes fewer switches (e.g., fewer FETs) and fewer controls (e.g., simpler PWM controller), and thus has a smaller die solution.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. An apparatus comprising:
a battery terminal providing a battery voltage;
a charge pump coupled between the battery terminal and an interior node, and configured to provide an interior voltage at the interior node based on the battery voltage, wherein the interior voltage toggles between the battery voltage and two times the battery voltage;
a power inductor coupled between the interior node and a power supply terminal that provides a power voltage to a radio frequency (RF) transceiver, wherein:
the charge pump includes a flying capacitor, a first switch, a second switch, and a third switch;
the first switch is coupled between the battery terminal and the interior node, such that the interior node is connected to the battery terminal when the first switch is closed;
the second switch is coupled between the battery terminal and a connecting node, such that the connecting node is connected to the battery terminal when the second switch is closed;
the third switch is coupled between the connecting node and ground, such that the connecting node is connected to ground when the third switch is closed; and
a first terminal of the flying capacitor is directly coupled to the interior node without any switch in between, and a second terminal of the flying capacitor is directly coupled to the connecting node of the second switch and the third switch; and
a pulse-width modulation (PWM) controller, wherein:
the PWM controller is configured to receive a target power voltage, which is a target power level requested for the RF transceiver, and the power voltage at the power supply terminal as feedback; and the PWM controller is configured to control opening and closing of the first switch, the second switch, and the third switch in the charge pump.

2. The apparatus of claim 1 wherein each of the first switch, the second switch, and the third switch is implemented by a field-effect transistor (FET).

3. The apparatus of claim 2 wherein each of the first switch and the second switch is implemented by a P-type FET (PFET), and the third switch is implemented by a N-type FET (NFET).

4. The apparatus of claim 3 wherein:
the PWM controller is configured to control opening and closing of the first switch, the second switch, and the third switch via a first PWM signal, a second PWM signal, and a third PWM signal, respectively; and
the first PWM signal, the second PWM signal, and the third PWM signal are provided to gates of the first switch, the second switch, and the third switch, respectively.

5. The apparatus of claim 4 wherein the PWM controller controls a duty cycle of each of the first PWM signal, the second PWM signal, and the third PWM signal, so as to determine how long each of the first switch, the second switch, and the third switch remains open or closed.

6. The apparatus of claim 4 wherein the charge pump operates in a charging phase and then in a discharge phase to boost the interior voltage to a voltage level greater than the battery voltage.

7. The apparatus of claim 6 wherein the charge pump operates in the charging phase and then in the discharge phase to boost the interior voltage to about two times the battery voltage.

8. The apparatus of claim 7 wherein:
during the charging phase, the first PWM signal is low, the second PWM signal is high, and the third switch is high, such that the first switch and the third switch are closed, while the second switch is open; and
after the flying capacitor is charged to a same voltage as the battery voltage, the first PWM signal is high, the second PWM signal is low, and the third switch is low during the discharge phase, such that the first switch and the third switch are open, while the second switch is closed during the discharge phase.

9. The apparatus of claim 1 wherein each of the first switch, the second switch, and the third switch is a microelectromechanical system (MEMS) switch.

10. The apparatus of claim 1 wherein the charge pump operates in a charging phase and then in a discharge phase to boost the interior voltage to a voltage level greater than the battery voltage.

11. The apparatus of claim 10 wherein the charge pump operates in the charging phase and then in the discharge phase to boost the interior voltage to about two times the battery voltage.

12. The apparatus of claim 10 wherein:
during the charging phase, the PWM controller is configured to control the first switch and the third switch to be closed, and to control the second switch to be open; and
after the flying capacitor is charged to a same voltage as the battery voltage, the PWM controller is configured to control the first switch and the third switch to be open, and to control the second switch to be closed during the discharge phase.

13. The apparatus of claim 1 further comprising a digital-to-analog converter (DAC), wherein the target power voltage is provided by the DAC.

14. The apparatus of claim 13 further comprising a tracking amplifier with a first input port, a second input port, and an output port, wherein:
the tracking amplifier receives a power voltage from a power terminal for operation;
the first input port of the tracking amplifier receives the target power voltage from the DAC;
the second input port of the tracking amplifier is coupled to the power supply terminal to receive the power voltage as feedback; and
the output port of the tracking amplifier is coupled to the power supply terminal, wherein the tracking amplifier is configured to provide a tracked voltage in response to a difference between the target power voltage and the power voltage.

15. The apparatus of claim 14 further comprising an offset capacitor coupled between the output port of the tracking amplifier and the power supply terminal, wherein the offset capacitor is configured to provide an offset voltage to raise the tracked voltage to the power voltage so as to lower a minimum requirement of the power voltage for the tracking amplifier.

16. The apparatus of claim 15 wherein the offset voltage provided by the offset capacitor is about 1V.

17. The apparatus of claim 14 further comprising a mode switch coupled between the output port of the tracking amplifier and ground, wherein the mode switch is configured to enable or disable the tracking amplifier.

18. The apparatus of claim 1 further comprising a bypass capacitor coupled between the power supply terminal and ground.

* * * * *